United States Patent
Suwald

(10) Patent No.: US 9,406,013 B2
(45) Date of Patent: Aug. 2, 2016

(54) USER INTERFACE UNIT, SMART CARD AND MANUFACTURING METHOD

(71) Applicant: NXP B.V., Eindhoven (NL)

(72) Inventor: Thomas Suwald, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/688,901

(22) Filed: Apr. 16, 2015

(65) Prior Publication Data

US 2015/0302289 A1    Oct. 22, 2015

(30) Foreign Application Priority Data

Apr. 16, 2014    (EP) .................................... 14164866

(51) Int. Cl.
| | |
|---|---|
| *G06K 19/06* | (2006.01) |
| *G06K 19/077* | (2006.01) |
| *G06F 3/044* | (2006.01) |
| *G07F 7/10* | (2006.01) |
| *G06F 1/16* | (2006.01) |
| *H03K 17/96* | (2006.01) |

(52) U.S. Cl.
CPC ............ *G06K 19/07709* (2013.01); *G06F 1/16* (2013.01); *G06F 3/044* (2013.01); *G06K 19/07783* (2013.01); *G07F 7/1008* (2013.01); *H03K 17/9622* (2013.01); *G06F 2203/04103* (2013.01); *H03K 2017/9602* (2013.01)

(58) Field of Classification Search
CPC . G06F 1/16; G06F 2203/04103; G06F 3/044; G06K 19/07709; G06K 19/07783; G07F 7/1008; H03K 17/962

USPC .......................................... 235/492; 345/173
See application file for complete search history.

(56) References Cited

U.S. PATENT DOCUMENTS

| | | | |
|---|---|---|---|
| 8,416,207 B2* | 4/2013 | Kasajima | G06F 3/0412 |
| | | | 178/18.01 |
| 9,069,420 B2* | 6/2015 | Liu | G06F 3/044 |
| 2010/0134422 A1 | 6/2010 | Borras | |
| 2013/0086389 A1 | 4/2013 | Suwald | |
| 2014/0091815 A1 | 4/2014 | Suwald | |

FOREIGN PATENT DOCUMENTS

EP    2 667 156 A1    11/2013

OTHER PUBLICATIONS

Extended European Search Report for Patent Appln. No. 14164866.7 (Oct. 9, 2014).

* cited by examiner

*Primary Examiner* — Seung Lee

(57) ABSTRACT

There is disclosed a user interface unit for a smart card, said user interface unit comprising a two-dimensional capacitive sensor array, wherein the capacitive sensor array comprises an array of corner sensor elements each comprising a capacitor over its area, wherein the respective capacitors of neighboring corner sensor elements in each dimension extend towards each other thereby defining at least one intermediate region therebetween, the area of the or each intermediate region covered by the respective capacitors being in a respective fixed ratio. Furthermore, there is disclosed a corresponding smart card and a method of manufacturing a user interface unit for a smart card.

15 Claims, 16 Drawing Sheets

USER INTERFACE UNIT, SMART CARD AND MANUFACTURING METHOD

CROSS-REFERENCE TO RELATED APPLICATIONS

This application claims the priority under 35 U.S.C. §119 of European patent application no. 14164866.7, filed on Apr. 16, 2014, the contents of which are incorporated by reference herein.

FIELD

The present disclosure relates to a user interface unit for a smart card. Furthermore, the present disclosure relates to a corresponding smart card and to a method of manufacturing a user interface unit for a smart card.

BACKGROUND

Today, smart cards are widely used in society. For example, smart cards may be used as electronic identity (eID) cards. The end-user acceptance of such eID cards, however, is still relatively low. Although the eID cards are relatively secure, due to their cryptographic capabilities, they are usually not equipped with a user interface suitable for entering user credentials, i.e. a so-called "authentication interface". As a consequence, the majority of eID users still enter their PIN code through personal computers and laptops, which increases the risk that their credentials are intercepted by malicious software such as Trojans and key-logger programs.

It is known to integrate an authentication interface into a smart card. For example, EP 2 667 156 A1 describes a capacitive position sensor system for determining the position of an object, wherein the object is positioned within a sensitive area of the capacitive position sensor system and changes the capacitance of capacitors being arranged underneath the object. The capacitive position sensor system comprises a first plurality of sensing elements, each sensing element comprising a first capacitor having a first electrode and a second electrode, wherein each first electrode is coupled via a switch to a voltage supply to form a switched capacitor filter, wherein the second electrodes are coupled to form a sensing line, a sensing unit, wherein the sensing unit is adapted to sense a voltage level representing the amount of charge being present on the sensing line, and a control unit, wherein the control unit is adapted to apply a drive signal to each of the switches being coupled to the first electrodes. In one integration cycle, a part of the switches being coupled to the first electrodes is closed so that a part of the first capacitors is driven by a first drive signal, wherein the sensing unit is adapted to sense the voltage level representing the sum of the amount of charge of the part of the first capacitors, wherein the number of the switches being closed is at least two. The control unit is adapted to determine the position of the object by analyzing the results of a plurality of sensed voltage levels of a plurality of integration cycles. This capacitive position sensor system is an example of a touch-based user interface that may be embedded into a smart card.

It is still relatively difficult to fabricate a multi-functional eID card with an embedded authentication interface. For instance, it is typically necessary to use double-sided inlays requiring VIAs (i.e. contacts between both layers) and to use a large number of sensor terminals. It might be desirable to use a smaller number of sensor terminals, which in turn would require less interface connections to a processing module, thereby reducing cost. Reducing the number of sensor terminals may be achieved by reducing the number of sensors embedded in the authentication interface. For example, the authentication interface may be based on a relatively simple 2×2 sensor array, as shown in FIG. 1A. However, in that case the usable area of the authentication interface is relatively small, as shown in FIG. 1B. Therefore, a conflict seems to exist between the manufacturing requirements and the performance requirements of such interfaces.

FIGS. 1A and 1B show a conventional user interface unit. FIG. 1A shows a user interface unit 100 which comprises a plurality of capacitive sensors 102a, 102b, 102c, 102d. The capacitive sensors 102a, 102b, 102c, 102d are arranged in an array that has a size of 2 by 2 sensors. FIG. 1B shows a usable area 104 of the user interface unit 100 shown in FIG. 1A.

In such user interface units, the position of an object, for example a user's finger, is typically obtained by applying a center-of-gravity calculation to the activity levels determined for the individual sensors in the sensor arrays. However, the outer sensors exhibit a dead-zone at their perimeter where a change in position will not result in a change of the measured activity level. Typically, the size of the dead-zone in each dimension is the size of the sensor in that dimension minus the size of the finger. When applying a weighting function such as a center-of-gravity formula the resulting position is only valid inside apart of the total sensor area. The area in which a resulting position is valid is referred to as the "usable area" herein. The usable area is the total area covered by all sensors reduced by the dead-zone areas of all sensors, as indicated by the black dots in FIG. 1B. For a 2×2-sensor array, as shown in FIG. 1B, the usable area may have a size of ¼ of the total size of the sensor array. For a 3×3 sensor array the usable area may typically have a size of 4/9 of the total size of the sensor array. More sensors typically result in a larger relative usable area. For example, for a 4×4 sensor the usable area may have a size of 9/16 of the total size of the sensor array.

However, an increased number of sensors results in more sensor signals, which typically requires a longer capturing and processing time and hence requires more energy. Furthermore, in case of an array-like sensor structure having a size of 3 or more in each dimension, the inner sensors may not be contacted without signal crossings or VIAs. As a consequence, two-layer inlays with VIAs may be required, which may increase the manufacturing cost and reduce the user interface's reliability. Furthermore, sensor structures that require double-sided inlays may not support economic inlay manufacturing such as by silver-ink printing, which is typically requested by some smart card manufacturers.

SUMMARY

There is disclosed a user interface unit for a smart card, said user interface unit comprising a two-dimensional capacitive sensor array, wherein the capacitive sensor array comprises an array of corner sensor elements each comprising a capacitor over its area, wherein the respective capacitors of neighbouring corner sensor elements in each dimension extend towards each other thereby defining at least one intermediate region therebetween, the area of the or each intermediate region covered by the respective capacitors being in a respective fixed ratio.

According to an illustrative embodiment, the intermediate regions in both dimensions define at least one central region therebetween, and the capacitor from each corner sensor element extends over the or each respective central region in a respective fixed ratio.

According to a further illustrative embodiment, each capacitor has a first electrode and a second electrode, wherein the first electrode is specific to the sensor element comprising the respective capacitor, and wherein the second electrode is a common signal electrode.

According to a further illustrative embodiment, the at least one intermediate region is defined by interdigitated first electrodes of the capacitors extending from the neighbouring corner sensor units.

According to a further illustrative embodiment, the at least one intermediate region is defined by first electrodes of the capacitors extending from the neighbouring corner sensor units in a mutual spiral arrangement.

Furthermore, there is disclosed a smart card which comprises a user interface unit of the kind set forth, said smart card further comprising a processing unit for processing sensor signals generated by the user interface unit and a plurality of signal lines for transmitting said sensor signals from the user interface unit to the processing unit, wherein each one of the capacitors is connected to one of the signal lines, wherein each one of the capacitors is arranged to generate one of the sensor signals and to transmit said one of the sensor signals to the processing unit through said one of the signal lines.

According to an illustrative embodiment, the processing unit is arranged to execute a computer program which applies a weighting function to the sensor signals generated by the user interface unit.

According to a further illustrative embodiment, said smart card further comprises a wireless communication module and a loop antenna for wireless communication, wherein the wireless communication module comprises an integrated antenna cross-over, said integrated antenna cross-over comprising a first antenna terminal of the wireless communication module being located outside the loop of the antenna and a second antenna terminal of the wireless communication module being located inside the loop of the antenna.

According to a further illustrative embodiment, the processing unit and the wireless communication module are comprised in a monolithically integrated circuit.

According to a further illustrative embodiment, said smart card further comprises a keypad which overlays the user interface unit and/or which is integrated with the user interface unit.

According to a further illustrative embodiment, said smart card further comprises a user feedback indicator for guiding a user through a touch-based user input process.

According to a further illustrative embodiment, the user feedback indicator is arranged to be placed on an inlay of said smart card.

According to a further illustrative embodiment, the user interface element is arranged to receive a touch-based user input which represents a gesture for activating a function of the smart card.

Furthermore, there is disclosed a method of manufacturing a user interface unit for a smart card, the method comprising providing the user interface unit with a two-dimensional capacitive sensor array and providing the capacitive sensor array with an array of corner sensor elements each comprising a capacitor over its area, wherein the respective capacitors of neighbouring corner sensor elements in each dimension extend towards each other thereby defining at least one intermediate region therebetween, the area of the or each intermediate region covered by the respective capacitors being in a respective fixed ratio.

DESCRIPTION OF DRAWINGS

Embodiments will be described in more detail with reference to the appended drawings, in which:

FIG. 9AA shows an example of an implementation of pipeline processing.

DESCRIPTION OF EMBODIMENTS

In accordance with the present disclosure a user interface unit for a smart card is provided. The user interface unit comprises a two-dimensional capacitive sensor array. The capacitive sensor array comprises an array of corner sensor elements, and each corner sensor element comprises a capacitor over its area. The respective capacitors of neighbouring corner sensor elements extend towards each other in each dimension, thereby defining at least one intermediate region between the neighbouring corner sensor elements. Furthermore, the area of the or each intermediate region covered by the respective capacitors is in a respective fixed ratio. For example, if the capacitive sensor array has a size of 2 by 2 sensor elements, then an intermediate region defined by the upper two sensor elements extending towards each other may have a 50:50 ratio. In this way, a 'hardware weighting' function may be applied to the signals generated by the sensor elements, in which the ratio 50:50 effectively represents a weighting factor of 0.5.

Figure 2:
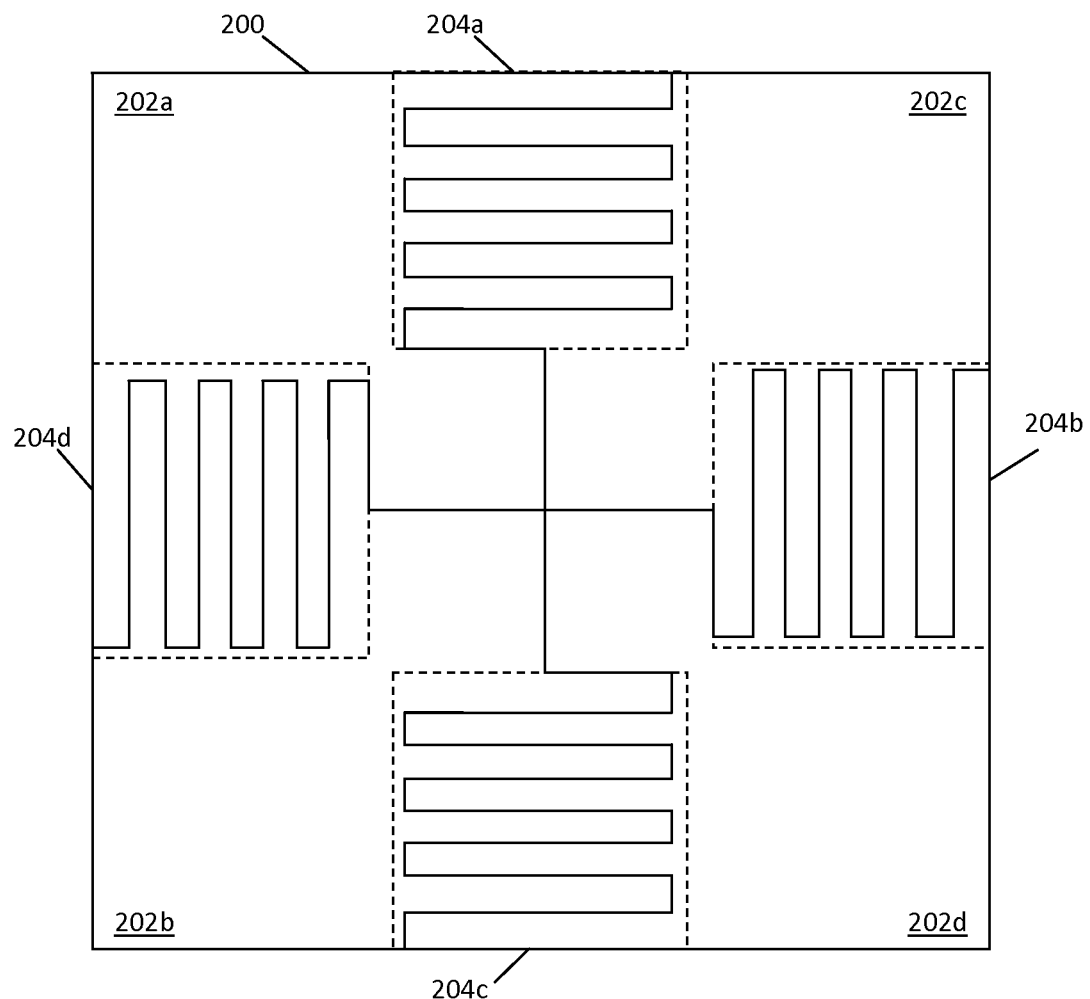
FIG. 2 shows an illustrative embodiment of a user interface unit.

FIG. 2 shows an illustrative embodiment of a user interface unit 200. In this example, the user interface unit 200 comprises four capacitive sensors 202a, 202b, 202c, 202d. The capacitive sensors 202a, 202b, 202c, 202d are arranged in an array of 2 by 2 sensor elements. The capacitive sensors 202a, 202b, 202c, 202d are an example of corner sensor elements whose capacitors extend towards each other in an interlaced manner. Thereby, intermediate regions 204a, 204b, 204c, 204d are defined. The area of each intermediate region which is covered by the respective capacitors is in a fixed ratio of 50:50. For example, in the first intermediate region 204a, the respective capacitors of sensor elements 202a and 202c each cover 50% of the total area covered by said capacitors. Thus, if this intermediate region 204a is touched, then both sensor elements 202a, 202c generate a signal that is weighted with a factor 0.5. In particular, FIG. 2 shows an example of symmetrical interlacing. Interlacing the sensors as shown may result in a larger usable area compared to a conventional 2×2 sensor array. Thus, in this way, a 2×2 capacitive sensor array may effectively provide a resolution of a 3×3 capacitive sensor array, for example.

Figure 3A:
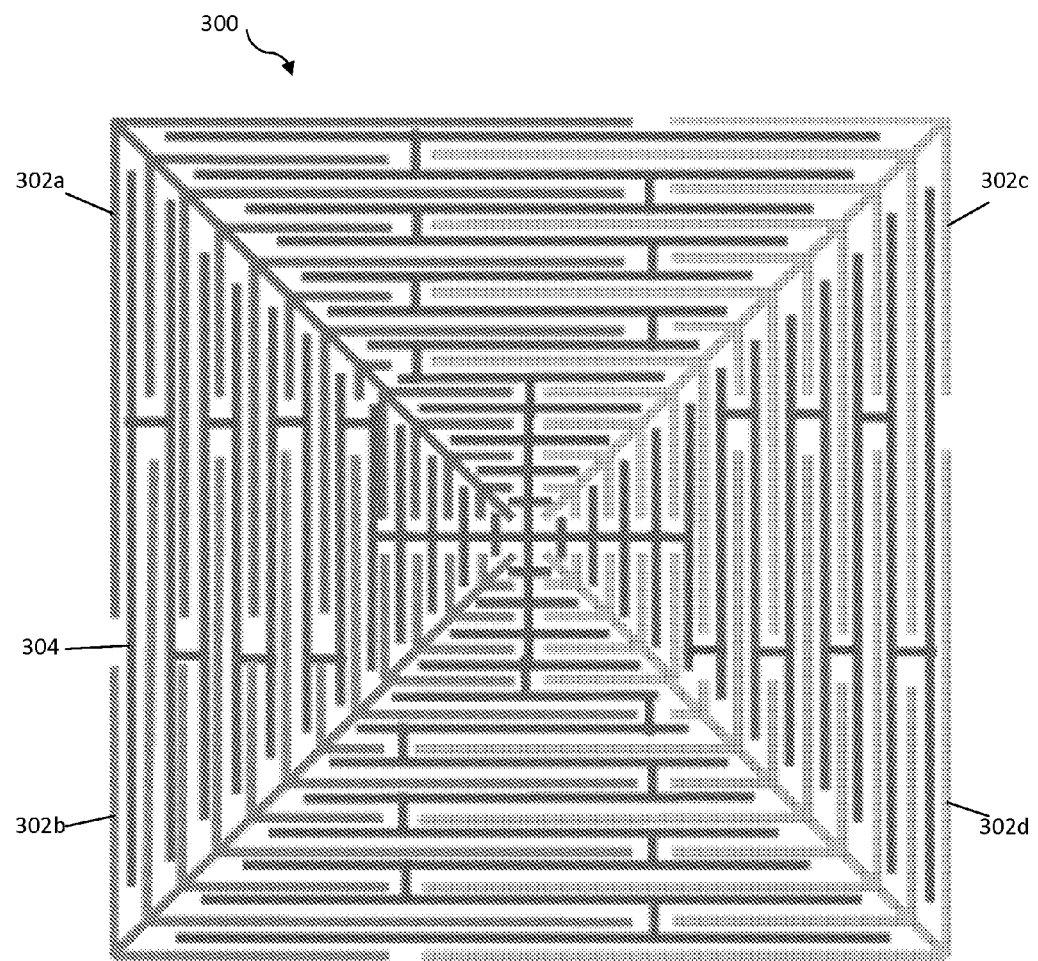
FIG. 3A shows an example of an implementation of a user interface unit.

FIG. 3A shows an example of an implementation of a user interface unit 300. In particular, the sensor array which is shown schematically in FIG. 2 may be implemented by means of the structure shown in FIG. 3. The user interface unit 300 comprises four sensor-specific electrodes 302a, 302b, 302c, 302d, each of which forms a part of a corresponding capacitive sensor 202a, 202b, 202c, 202d. Another part of the capacitive sensors 202a, 202b, 202c, 202d is formed by a common electrode 304. The common electrode 304 may be common to all capacitive sensors 202a, 202b, 202c, 202d. Thus, each capacitive sensor 202a, 202b, 202c, 202d comprises a capacitive structure that may detect the presence of non-isolating objects, such as human fingers. A 2×2 sensor array may contain four capacitive sensors of this kind; typically the sensor-specific electrode of each capacitive sensor is electrically connected to a sensor-specific signal line while the common electrode is electrically connected to a common reference signal line.

Figure 3B:
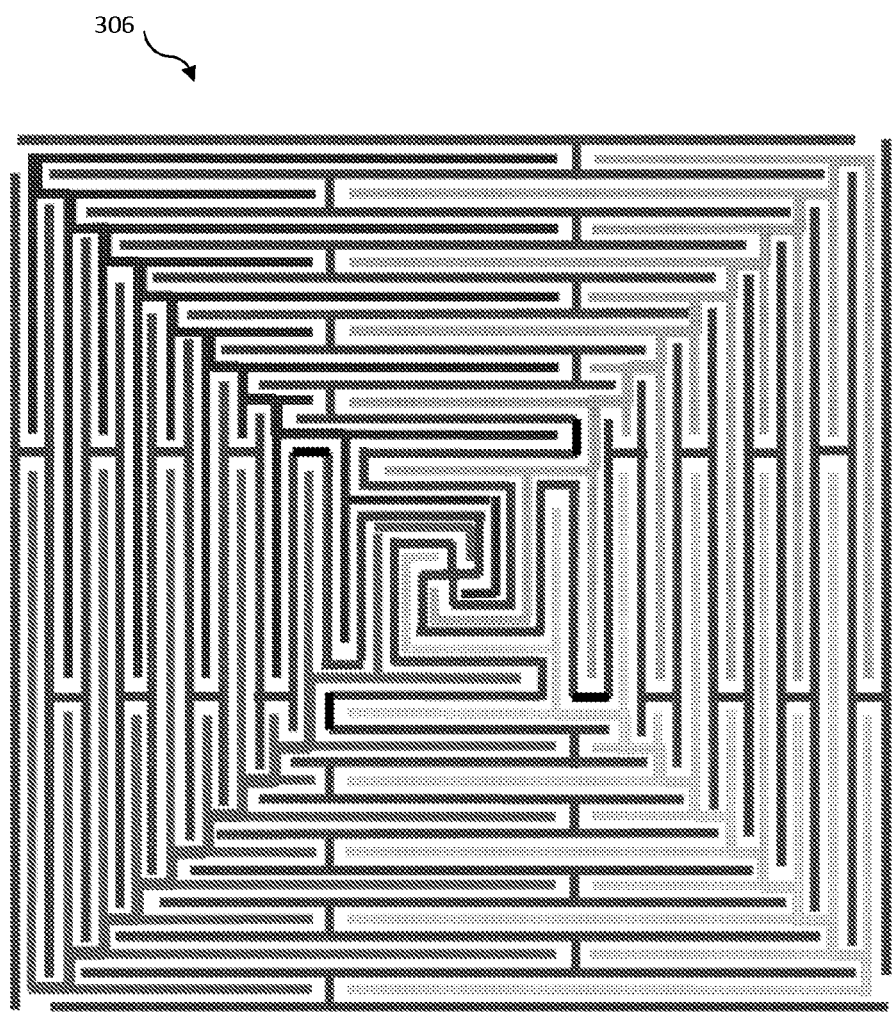
FIG. 3B shows another example of an implementation of a user interface unit.

FIG. 3B shows another example of an implementation of a user interface unit 306. In this example, the intermediate regions in both dimensions define a central region therebetween. Furthermore, the capacitor from each corner sensor element extends over the central region in a fixed ratio. The central region is defined by first electrodes of the capacitors extending from the neighbouring corner sensor units in a mutual spiral arrangement. It is noted that such a mutual spiral arrangement may also be used in the intermediate regions, instead of the implementation based on interdigitated first electrodes which is shown in the figure.

Figure 3C:
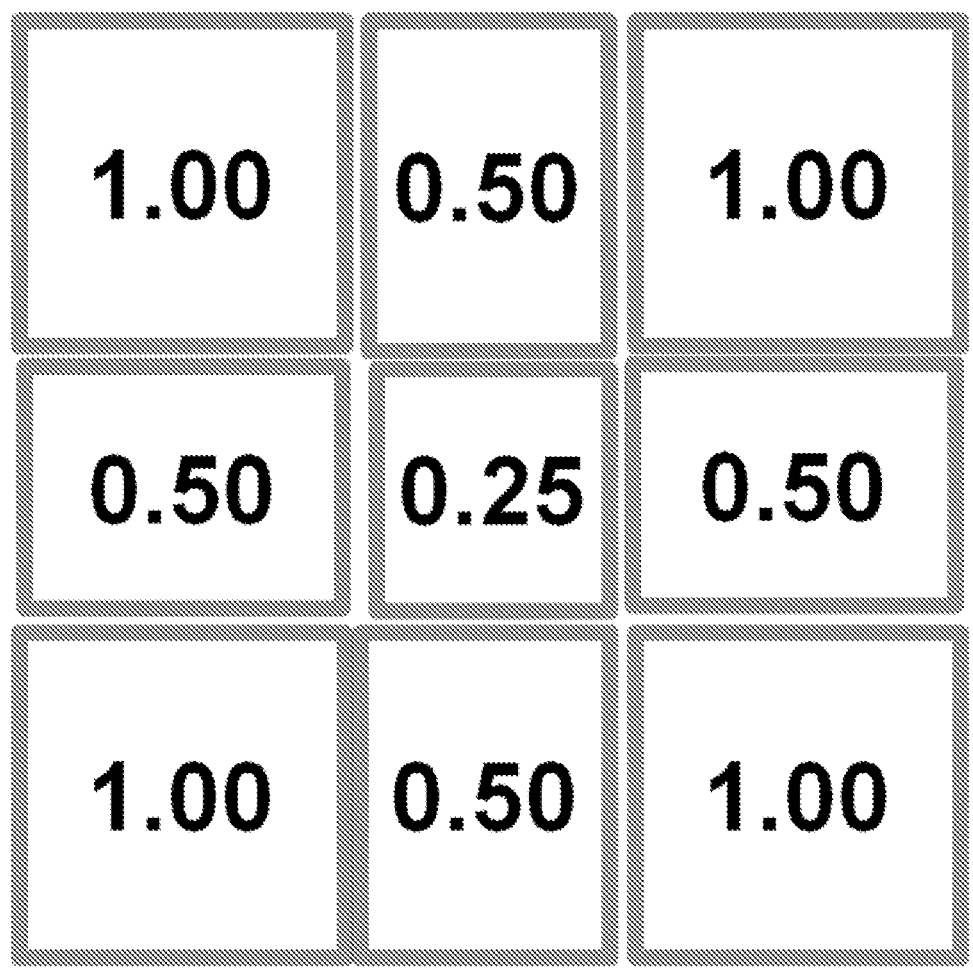
FIG. 3C shows a distribution of hardware-weighting factors for regions of the user interface unit.

FIG. 3C shows a distribution of hardware-weighting factors for regions of the user interface unit as shown in FIG. 3B. Each of the intermediate regions between the neighbouring corner sensor elements has a hardware-weighting factor of 0.5. That is to say, if one of these intermediate regions is touched, then the corresponding sensor elements each generate a signal that carries a weight of 0.5 compared to the signal generated by the upper-left sensor element alone if the upper-left region is touched, for example. In the center region, the hardware-weighting factor is 0.25. That is to say, if the central region is touched, then four sensor elements will generate a signal, each of which carries a weight of 0.25 compared to the signal generated by the upper-left sensor element alone if the upper-left region is touched, for example.

Figure 3D:
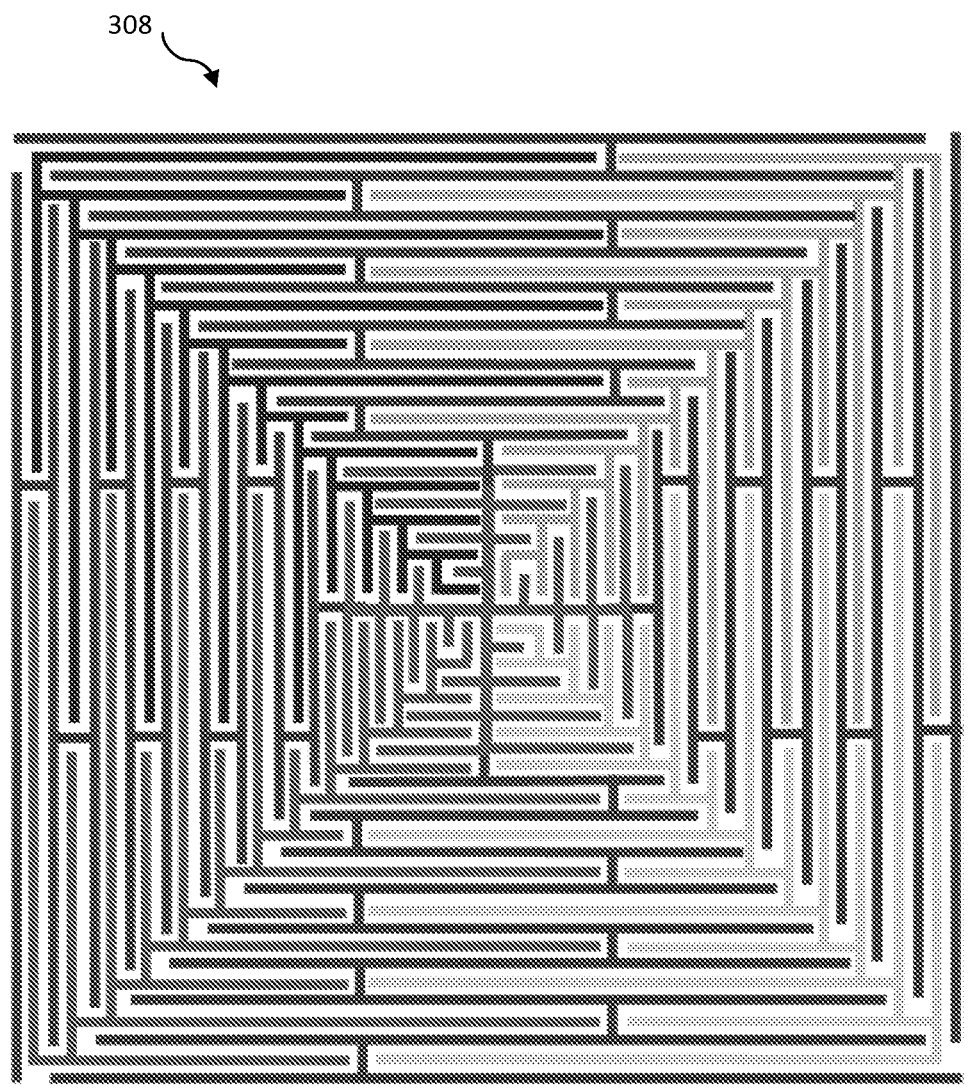
FIG. 3D shows another example of an implementation of a user interface unit.

FIG. 3D shows another example of an implementation of a user interface unit 308. This implementation has a simplified center design without interlacing of the kind set forth.

Figure 1A:
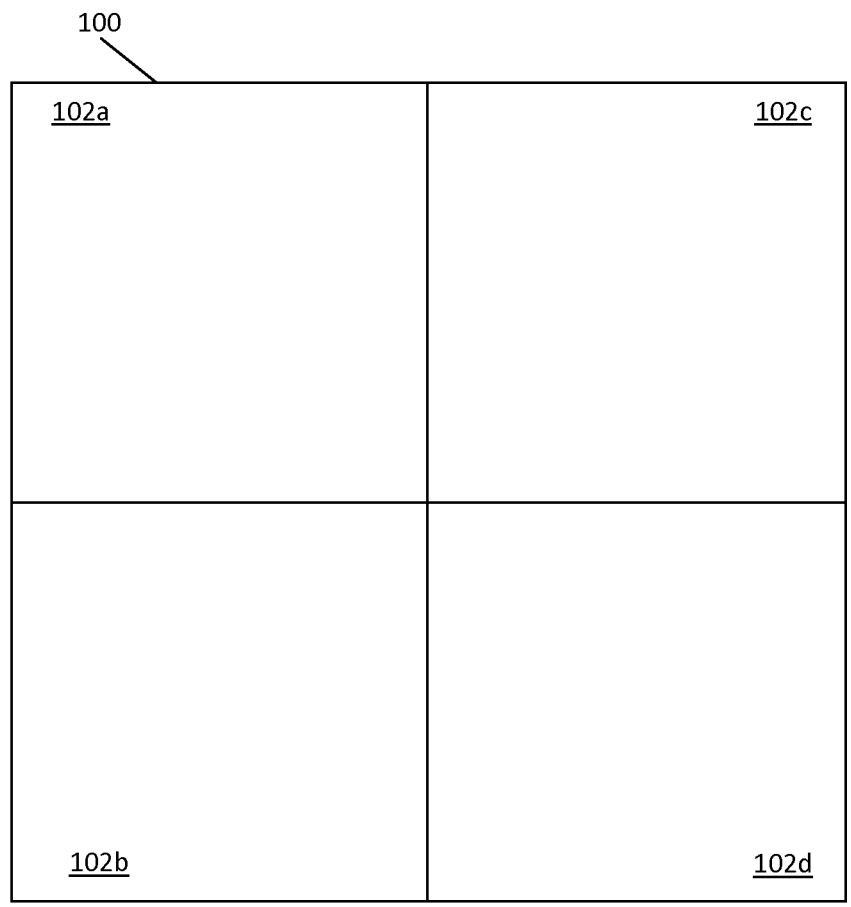
FIGS. 1A and 1B show a conventional user interface unit.
Figure 1B:
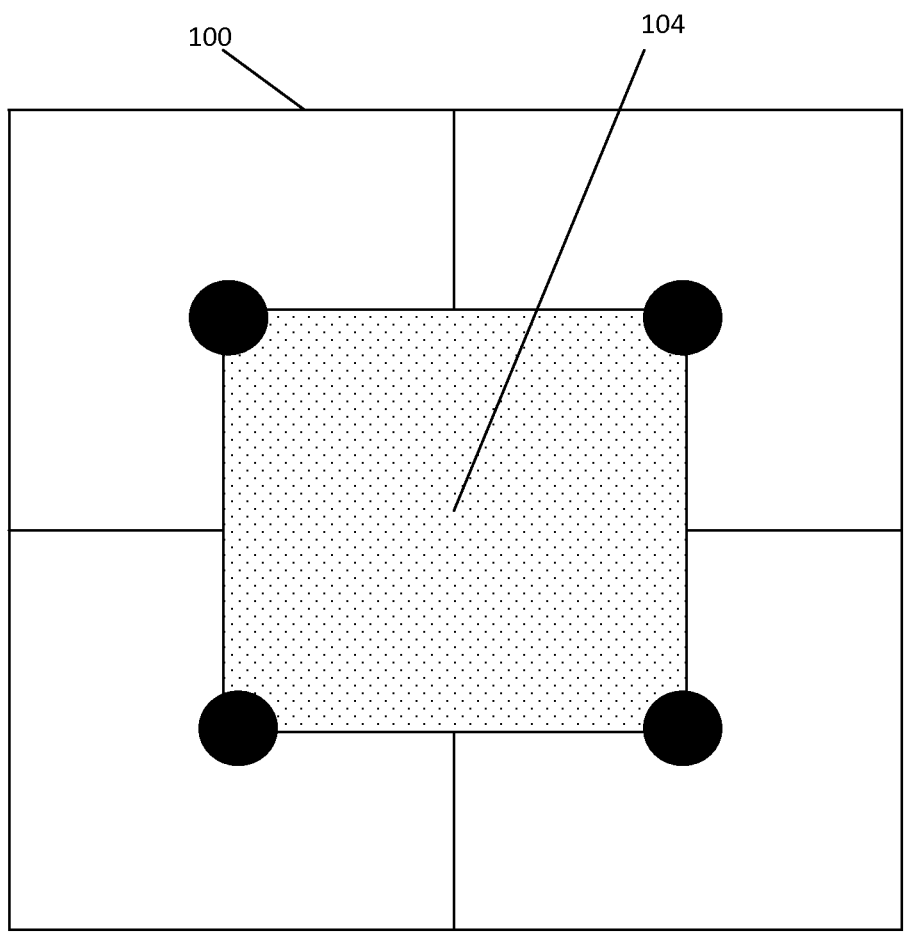
Figure 4:
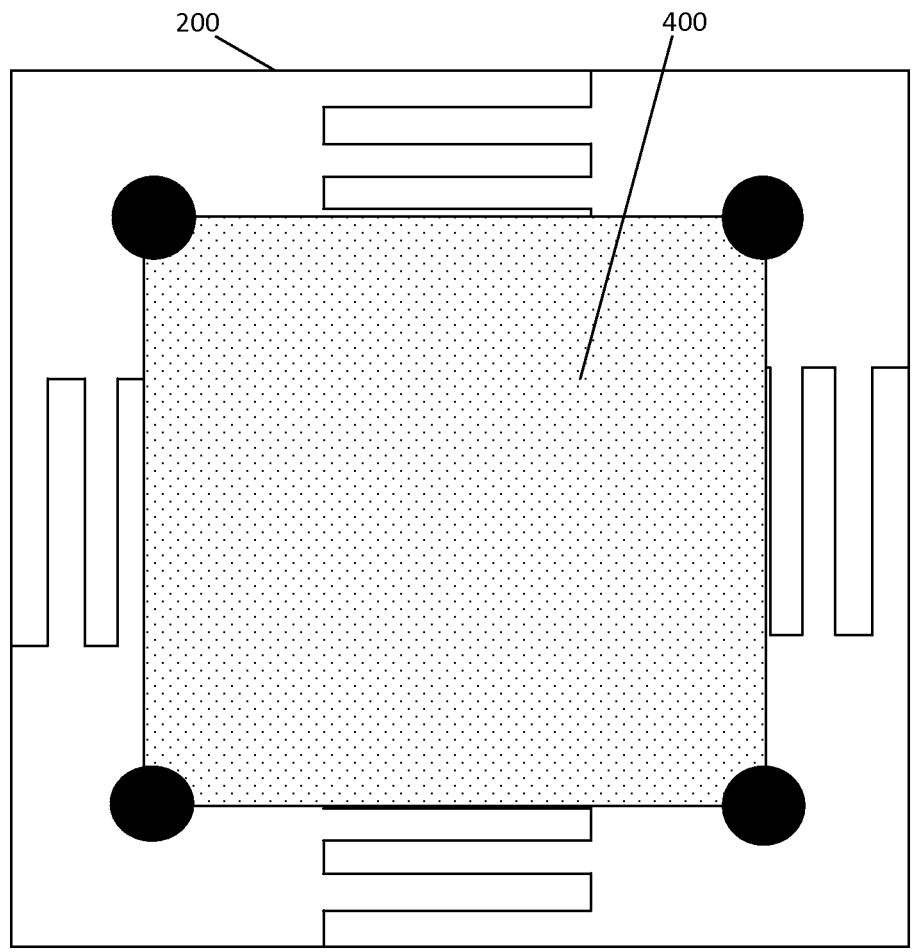
FIG. 4 shows a usable area on a user interface unit.

FIG. 4 shows a usable area on a user interface unit 200 of the kind set forth. Compared to the conventional sensor array shown in FIGS. 1A and 1B, the boundaries of the insensitive area of the capacitive sensors have moved towards the corners of the sensor array. This may be explained as follows. In the array, a "dead-zone" may exist, for example in case the size of an individual sensor is larger than the size of a finger tip. In this zone, moving the finger will hardly change the activity level of the individual sensor, because the distance between the finger and the other individual sensors is too large. In other words, in the so-called dead-zone the sensor array is insensitive to movements of the finger. However, intermediate regions in accordance with the present disclosure may effectively reduce the so-called dead-zone, and the usable area 400 may become larger.

Figure 5:
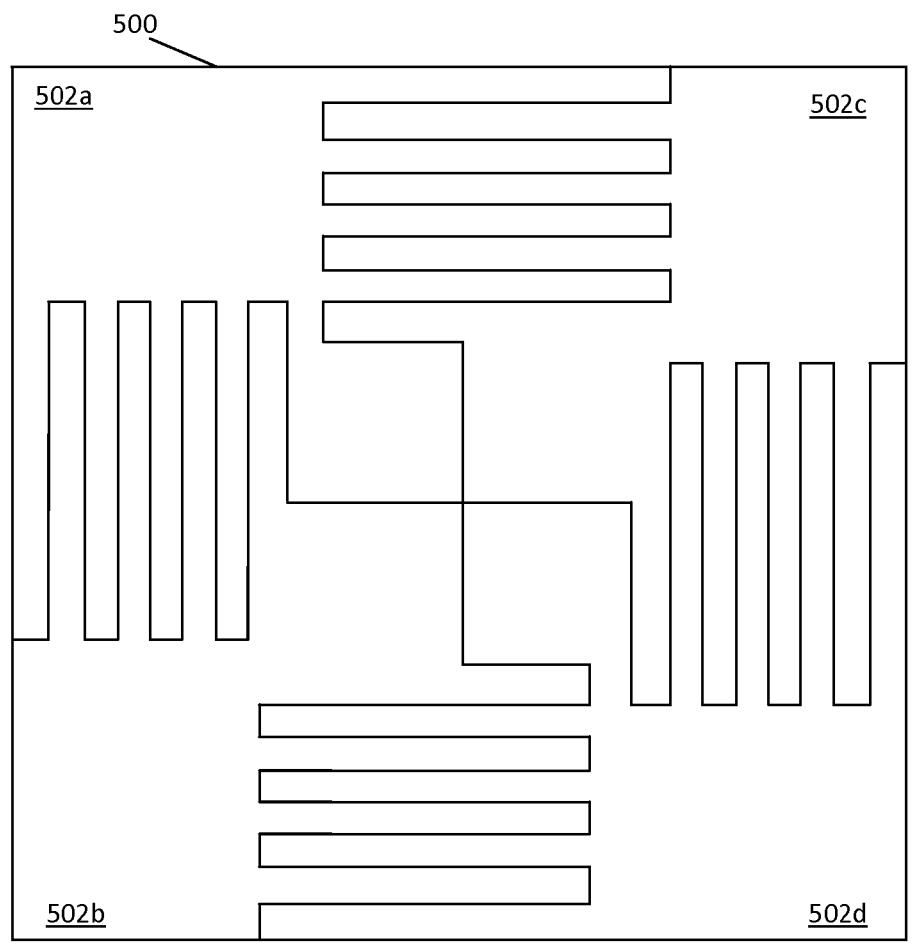
FIG. 5 shows a further illustrative embodiment of a user interface unit.

FIG. 5 shows a further illustrative embodiment of a user interface unit 500. In this example, the user interface unit 500 again comprises four capacitive sensors 502a, 502b, 502c, 502d. Again, the capacitive sensors 502a, 502b, 502c, 502d are arranged in an array of 2 by 2 sensor elements, which are interlaced with each other. In particular, FIG. 5 shows an example of reflectionally asymmetrical interlacing. This embodiment may improve the sensitivity to movements of a finger at the perimeter of the sensor array.

Figure 6:
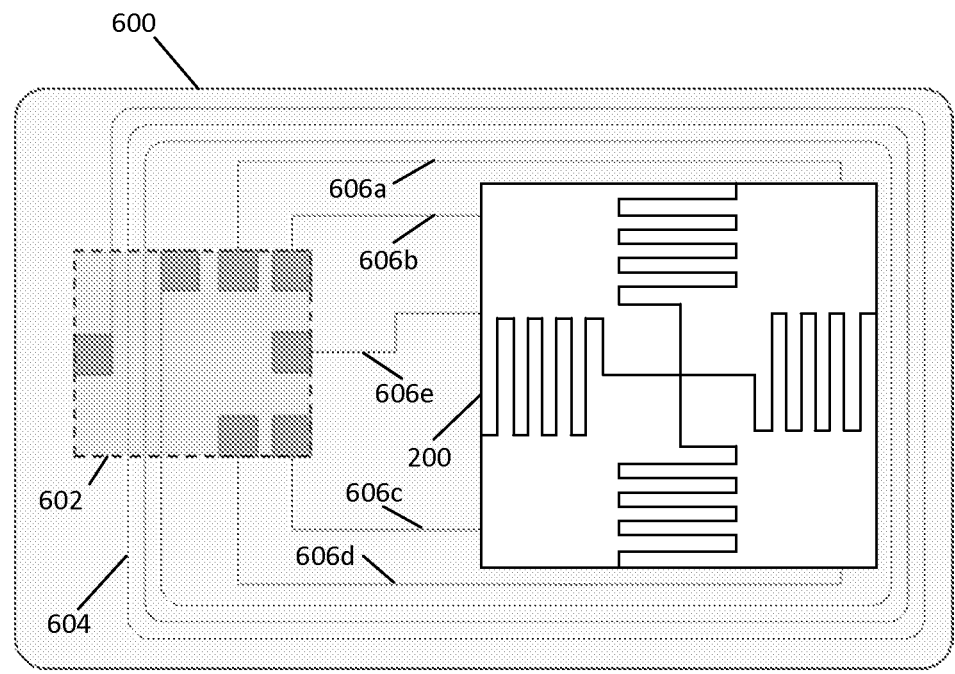
FIG. 6 shows an illustrative embodiment of a smart card.

FIG. 6 shows an illustrative embodiment of a smart card 600. In particular, the smart card 600 comprises a single-layer inlay in which a user interface unit in accordance with the present disclosure has been embedded. In this example, the smart card 600 comprises a user interface unit 200 as shown in FIG. 2. Furthermore, the smart card may comprise a processing module 602 which comprises a wireless communication module, in particular an REID module, as well as a processing unit of the kind set forth. Furthermore, the processing module 602 may be connected via sensor-specific signal lines 806a, 806b, 806c, 806d, to the respective capacitive sensors of the user interface unit 200. Furthermore, the processing module 602 may be connected to the user interface unit 200 via a common signal line 806e of the kind set forth. The smart card 600 may further comprise an antenna 604 for wireless communication, in particular an RFID antenna, connected to the wireless communication module of the processing module 602.

Furthermore, the RFID module may comprise an integrated antenna cross-over. The term "integrated antenna cross-over" refers to antenna terminals which are integrated in the RFID module and which are arranged in such a way that signal lines which are needed for connecting the antenna to the RFID module do not cross-over one another. In particular, the RFID module's contact terminals that connect the module to the antenna 604 may be arranged in the manner shown in FIG. 6, i.e. without a cross-over in the form of an additional wire crossing the antenna wires. For example, in case the antenna is a rectangular loop antenna as shown, the integrated antenna cross-over may comprise a first antenna terminal of the RFID module being located outside the loop of the antenna and a second antenna terminal of the RFID module being located inside the loop of the antenna. This design may achieve that the antenna 604 does not cross any of the signal lines 606a, 606b, 606c, 606d, 606e, and that no other signal-crossings may be required. Thus, this design may further facilitate creating single-sided printed inlays without VIAs. It is noted that only a schematic positioning of the signal lines 606a, 606b, 606c, 606d, 606e is shown, i.e. the skilled person may further optimize this design in order to minimize the cross-coupling between signal lines 606a, 606b, 606c, 606d, 606e and the antenna 604.

Figure 7:
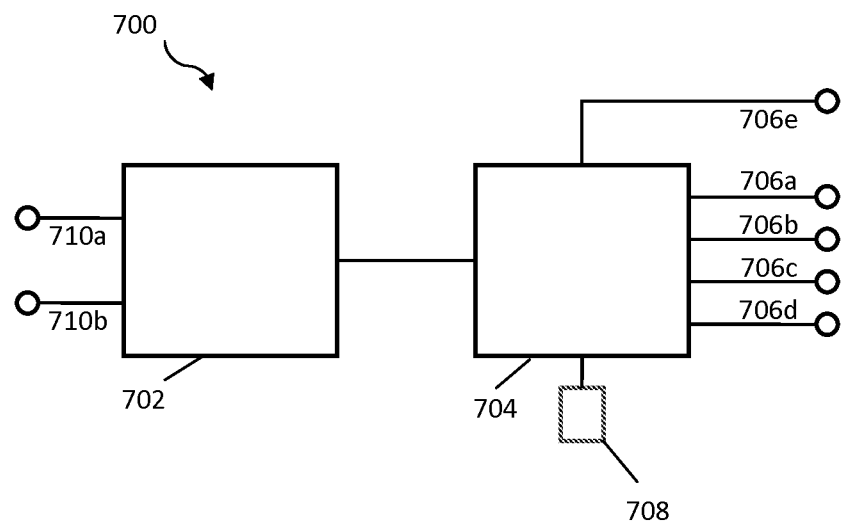
FIG. 7 shows an example of a processing module.

FIG. 7 shows an example of a processing module 700 of the kind set forth. The processing module 700 comprises a first sub-module 702, which in turn may comprise a rectifier, a power supply and a secure element. Each of these features may be implemented by means of hardware components which are known as such, for example. The first sub-module 702 may comprise a first antenna terminal 710a and a second antenna terminal 710b arranged as described with reference to FIG. 6 above. The first sub-module 702 may exchange data with a second sub-module 704, which may comprise an input/output controller and a touch sensor position decoder. The second sub-module 704 may, be arranged to control an optical feedback indicator 708. Furthermore, the second sub-module 704 may be connected to sensor-specific signal lines 706a, 706b, 706c, 706d, and to a common signal line 706e, which are in turn connected to the user interface unit (not shown). The components of the first sub-module 702 and the second sub-module 704 may be individual integrated components and discrete components or monolithically integrated components. The optical feedback indicator 708 may be included and may provide better user guidance during data entry. Alternatively and without limitation, an acoustic feedback indicator may be used.

Figure 8:
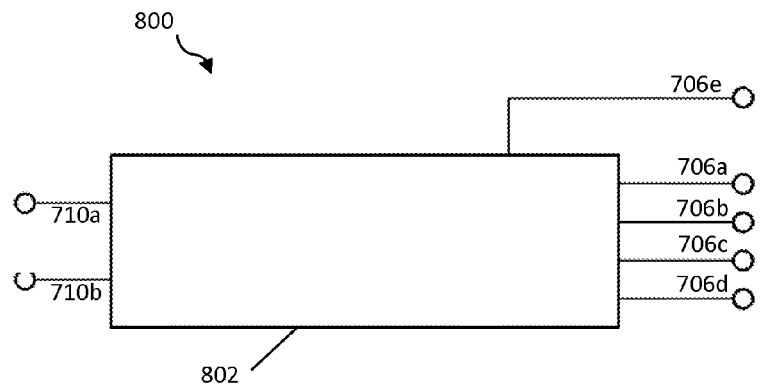
FIG. 8 shows a further example of a processing module.

FIG. 8 shows a further example of a processing module 800. In this example, the processing module 800 comprises a monolithically integrated circuit 802 comprising the rectifier, the power supply, the secure element and the touch sensor position decoder. In such a monolithically integrated version the user interface unit may function as astute machine that may control the required input/output function of the processing module 800.

Figure 9A:
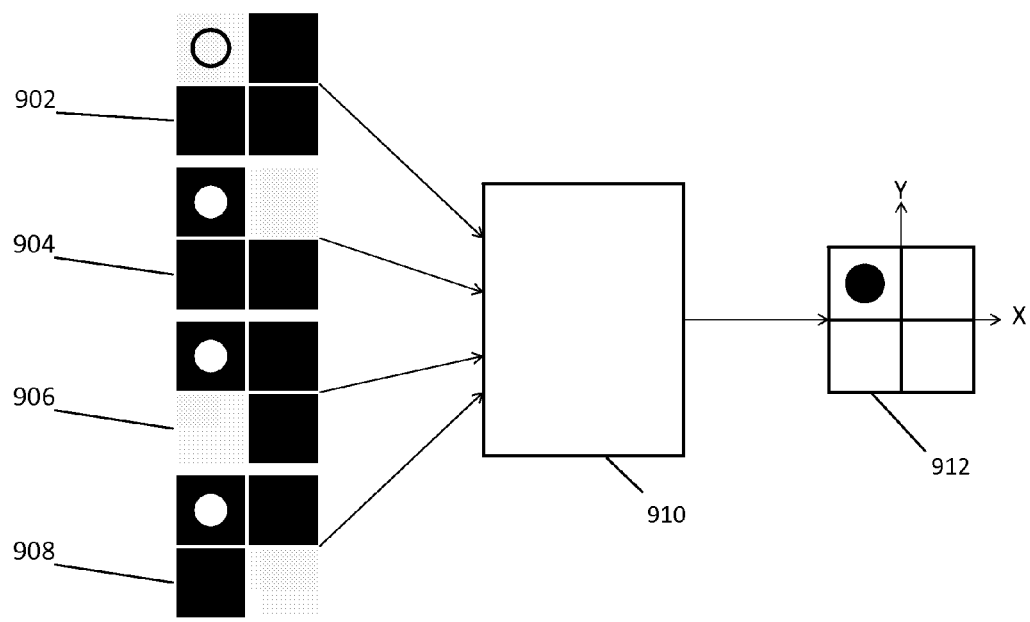
FIG. 9A shows an illustrative operation of a user interface unit.
Figure 9A:
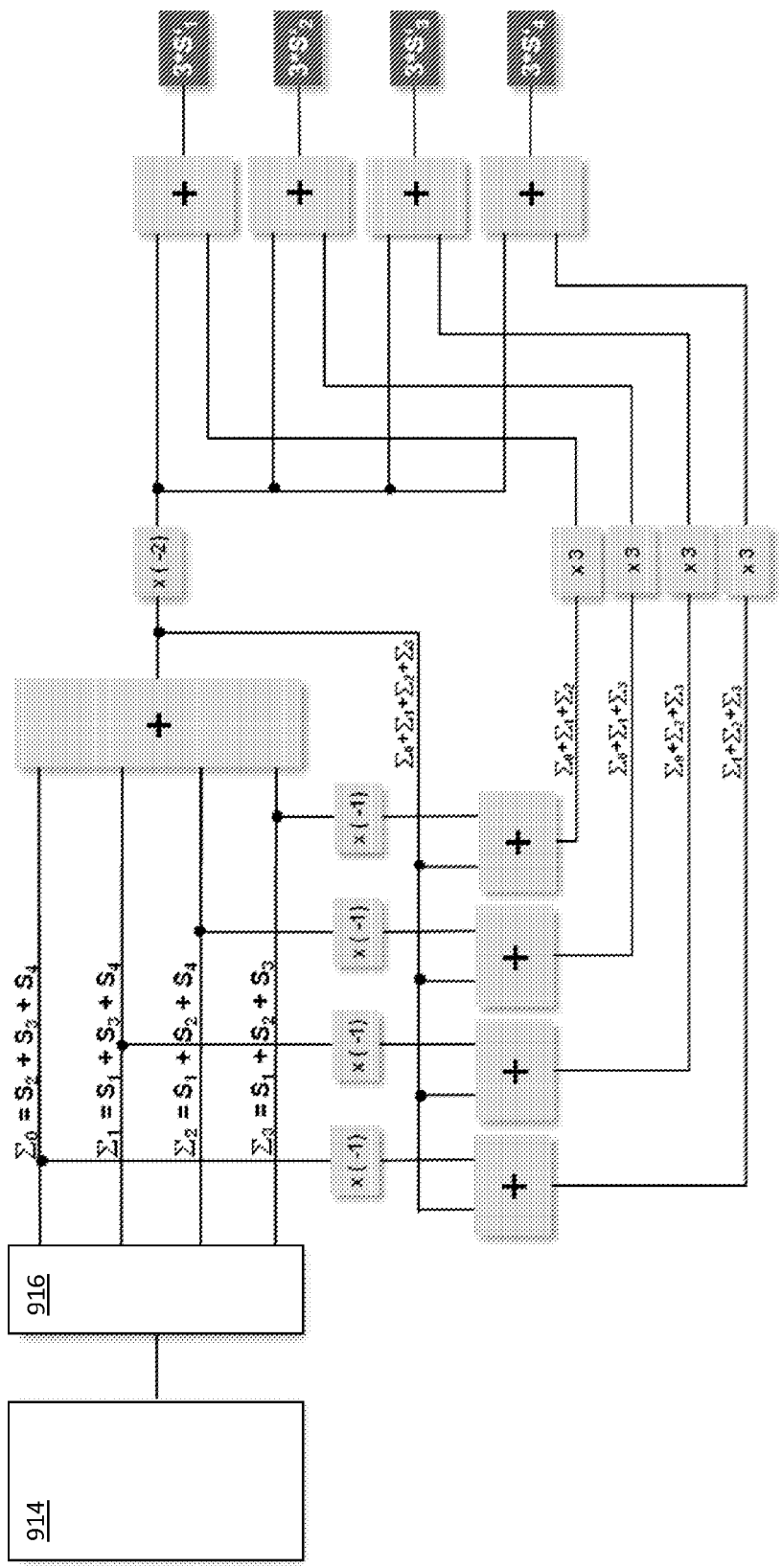

FIG. 9A shows an illustrative operation of a user interface unit. In particular, it shows the use of a Finite Impulse Response (FIR) noise filter functions that may be used in combination with a user interface unit of the kind set forth: in a scanning step 902, the upper-left capacitive sensor is touched, but not evaluated. This is depicted in the figure by a circle (illustrating touching the sensor) in a blank—that is, white—upper-left sensor position. In three further scanning steps 904, 906, 908, the upper-left capacitive sensor is touched and evaluated. This is depicted in the figure by a circle (illustrating touching the sensor) in a black upper-left sensor position. It is noted that the term "evaluated" means that a sensor signal is used for determining a position. In contrast, the term "not evaluated" means that a sensor generates a signal because it is touched, but this signal is ignored in the subsequent calculation for determining a position. For example, this may be controlled by means of switches which enable/disable the measurement of the capacitance variation of a particular capacitive sensor. In that case, "evaluated" means the switches are controlled in such a way that the capacitance variation is indeed measured, and "not evaluated" means that the switches are for example kept in an inactive state, such that the capacitance variation is not measured. A filter and weighted averaging step 910 yields a position determination 912. Every sensor may have an activity level, i.e. it may generate a signal that has a strength which is indicative of the level of engagement with a non-isolating object that may be brought close to the sensor, e.g. a human finger. In order to perform an FIR noise filter function three out of four activity levels may be captured such that three out of four sensors are evaluated and the sum of their activity levels is obtained in a single step. In the example shown in FIG. 9A only four consecutive scans may be required to determine the noise-filtered activity levels of each individual sensor.

Blanking one sensor signal in every sampling interval results for a four-field sensor design in an equation system with 4 equations and 4 unknowns which may be solved by Gaussian elimination:

$$S_2+S_3+S_4=\Sigma_0 \quad (1)$$

$$S_1+S_3+S_4=\Sigma_1 \quad (2)$$

$$S_1+S_2+S_4=\Sigma_2 \quad (3)$$

$$S_1+S_2+S_3=\Sigma_3, \quad (4)$$

wherein $S_{1, 2, 3, 4}$ represents a sample signal from sensor 1, 2, 3 or 4, and $\Sigma_{0, 1, 2, 3}$ represents the sum of the sampled signals at sampling interval 0, 1, 2 or 3.

The equation system indicates that sum samples in only 3 out of 4 sampling intervals provide information relevant to one specific sensor. That is to say, in a 4-field-sensor configuration only 3 out of 4 samples hold information related to one sensor (e.g. S1) While one out of samples does not have any information. However, by means of pipeline processing upsampling may be performed for the missing sample. That is to say, a set of filtered sensor signals may be provided in every sampling interval.

FIG. 9AA shows an example of an implementation of pipeline processing. In FIG. 9AA, S1 represents the activity level of sensor X1, S2 represents the activity level of sensor X2, S3 represents the activity level of sensor X3, and S4 represents the activity level of sensor X4. Furthermore, S'i represents the filtered activity level of sensor Xi, wherein i=1, 2, 3 or 4. The filter function corresponding to this implementation is:

$$3*S'_i=3*(Sum_{i1}+Sum_{i2}+Sum_{i3})-2*(Sum_0+Sum_1+Sum_2+Sum_3).$$

wherein $Sum_0=\Sigma_0$, $Sum_1=\Sigma_1$, $Sum_2=\Sigma_2$, $Sum_3=\Sigma_3$, $Sum_{i1}+Sum_{i2}+Sum_{i3}=\Sigma_{1+}\Sigma_{2+}\Sigma_3$ for the first sampling interval, $Sum_{i1}+Sum_{i2}+Sum_{i3}=\Sigma_{0+}\Sigma_{2+}\Sigma_3$ for the second sampling interval, $Sum_{i1}+Sum_{i2}+Sum_{i3}=\Sigma_{0+}\Sigma_{1+}\Sigma_3$ for the third sampling interval, and $Sum_{i1}+Sum_{i2}+Sum_{i3}=\Sigma_{0+}\Sigma_{1+}\Sigma_2$ for the fourth sampling interval. Thus, a set of filtered sensor signals may be provided in each sampling interval. By means of this filter function the filter performance may be increased.

The sensor signal processing may be split up into a column- or row-wise filtering. The direct-sampling sensor signal processing may combine sampling and filtering. This approach may enable fast sampling especially in case of quasi-static position data like PIN-pad entries. The position of the influencing object, e.g. a human finger, may be obtained from the filtered activity levels by a center-of-gravity (center-of-mass) formula. The sensor configuration may be kept relatively simple in order to obtain easy-to-process integer weighting factors during the position calculation. In case of four sensors the position calculation may be implemented with simple integer coefficients. Only four scans (measurements) may be required to determine a single PIN-pad position. For authentication purposes the raw position components X and Y may be provided to a secure element with the purpose of verifying a PIN code on-card. The verification result may be communicated in encrypted form to a connected host device for further processing.

Figure 9B:
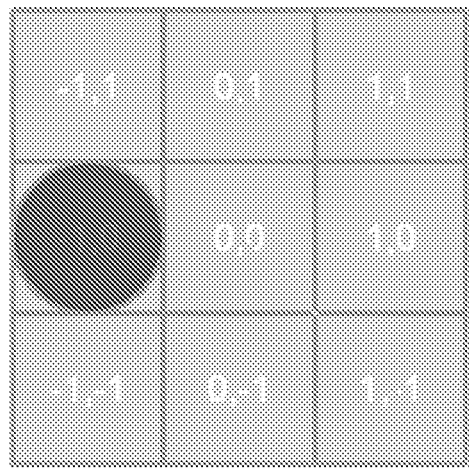
FIG. 9B shows a distribution of regions as defined by a capacitive sensor array.

FIG. 9B shows a distribution of regions as defined by a capacitive sensor array as shown, for example, in FIG. 3B. The respective corner regions have positions P(−1,1), P(1,1), P(1,−1) and P(−1,−1). The respective intermediate regions have positions P(0,1), P(1,0), P(0,−1) and P(−1,0). The central region has position P(0,0). FIG. 9B shows that the intermediate region at position P(−1,0) is touched. The user interface unit may determine this position as follows. Since the intermediate region at position P(−1,0) is touched, the activity level at this position is 100%, while it is 0% at all other positions. The sensor element in the upper-left corner (referred to as 'sensor X1') captures:

For sensor part P(−1,1): 0*1.0
For sensor part P(0,1): 0*0.5
For sensor part P(−1,0): 100*0.5
For sensor part P(0,0): 0*0.25

The factors 1.0, 0.5, 0.5 and 0.25 correspond to the hardware-weighting factors for the different regions as shown in FIG. 3C. Thus, the hardware-weighted captured activity level of sensor X1 is:

$$(100*0.5)/(1+0.5+0.5+0.25)=22$$

Furthermore, sensors X2 and X3, which are the sensor elements in upper-right and lower-right corners, capture a hardware-weighted activity level of 0, and sensor X4, which is the sensor element in the lower-left corner, captures a hardware-weighted activity level of 22. The position calculation may involve a software weighting function which may be applied to the hardware-weighted activity levels of the respective sensor elements. For example, the position may now be calculated as follows:

$$X=(-22+0+0-22)/(22+0+0+22)=-1$$

$$Y=(22+0-0-22)/(22+0+0+22)=0$$

Figure 9C:
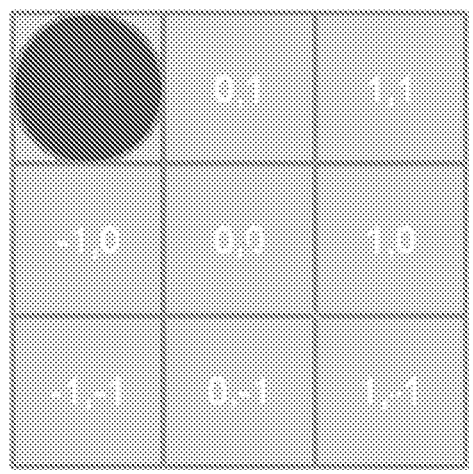
FIG. 9C shows a distribution of regions as defined by a capacitive sensor array.

FIG. 9C shows a distribution of regions as defined by a capacitive sensor array as shown, for example, in FIG. 3B. The respective corner regions have positions P(−1,1), P(1,1), P(1,−1) and P(−1,−1). The respective intermediate regions have positions P(0,1), P(1,0), P(0,−1) and P(−1,0). The central region has position P(0,0). FIG. 9C shows that the intermediate region at position P(−1,1) is touched. The user interface unit may determine this position as follows. Since the intermediate region at position P(−1,1) is touched, the activity level at this position is 100%, while it is 0% at all other positions. The sensor element in the upper-left corner (referred to as 'sensor X1') captures:
For sensor part P(−1,1): 100*1.0
For sensor part P(0,1): 0*0.5
For sensor part P(−1,0): 0*0.5
For sensor part P(0,0): 0*0.25

The factors 1.0, 0.5, 0.5 and 0.25 correspond to the hardware-weighting factors for the different regions as shown in FIG. 3C. Thus, the hardware-weighted captured activity level of sensor X1 is:

$$(100*1.0)/(1+0.5+0.5+0.25)=44$$

Furthermore, sensors X2, X3 and X4, which are the other sensor elements of the array, capture a hardware-weighted activity level of 0. The position calculation may involve a software weighting function which may be applied to the hardware-weighted activity levels of the respective sensor elements. For example, the position may now be calculated as follows:

$$X=(-44+0+0-0)/(44+0+0+0)=-1$$

$$Y=(44+0-0-0)/(44+0+0+0)=1$$

Figure 9D:
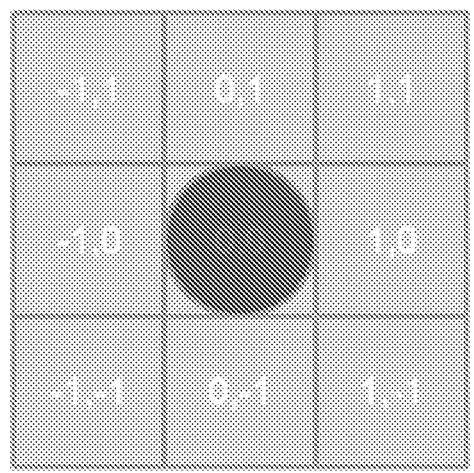
FIG. 9D shows a distribution of regions as defined by a capacitive sensor array.

FIG. 9D shows a distribution of regions as defined by a capacitive sensor array as shown, for example, in FIG. 3B. The respective corner regions have positions P(−1,1), P(1,1), P(1,−1) and P(−1,−1). The respective intermediate regions have positions P(0,1), P(1,0), P(0,−1) and P(−1,0). The central region has position P(0,0). FIG. 9D shows that the intermediate region at position P(0,0) is touched. The user interface unit may determine this position as follows. Since the intermediate region at position P(0,0) is touched, the activity level at this position is 100%, while it is 0% at all other positions. The sensor element in the upper-left corner (referred to as 'sensor X1') captures:
For sensor part P(−1,1): 0*1.0
For sensor part P(0,1): 0*0.5
For sensor pert P(−1,0): 0*0.5
For sensor part P(0,0): 100*0.25

The factors 1.0, 0.5, 0.5 and 0.25 correspond to the hardware-weighting factors for the different regions as shown in FIG. 3C. Thus, the hardware-weighted captured activity level of sensor X1 is:

$$(100*0.25)/(1+0.5+0.5+0.25)=11$$

Furthermore, sensors X2, X3 and which are the other sensor elements of the array, capture a hardware-weighted activity level of 11 as well. The position calculation may involve a software weighting function which may be applied to the hardware-weighted activity levels of the respective sensor elements. For example, the position may now be calculated as follows:

$$X=(-11+11+11-11)/(11+11+11+11)=0$$

$$Y=(11+11-11-11)/(11+11+11+11)=0$$

Figure 9E:
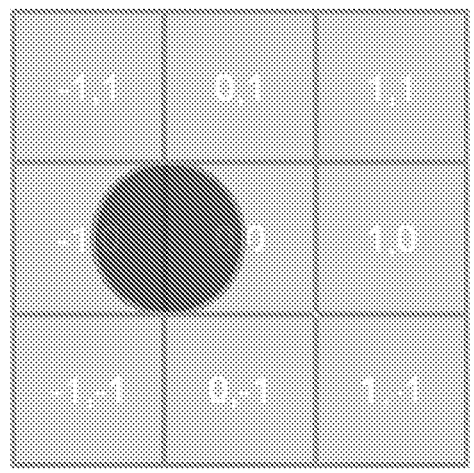
FIG. 9E shows a distribution of regions as defined by a capacitive sensor array.

FIG. 9E shows a distribution of regions as defined by a capacitive sensor array as shown, for example, in FIG. 3B. The respective corner regions have positions P(−1,1), P(1,1), P(1,−1) and P(−1,−1). The respective intermediate regions have positions P(0,1), P(1,0), P(0,−1) and P(−1,0). The central region has position P(0,0). FIG. 9E shows that a position between an intermediate region and the central region is touched. The user interface unit may determine this position as follows. The activity level is 50% at position P(−1,0) and 50% at position P(0,0). The activity level is 0% at all other positions. The sensor element in the upper-left corner (referred to as 'sensor X1') captures:
For sensor part P(−1,1): 0*1.0
For sensor part P(0,1): 0*0.5
For sensor part P(−1,0): 50*0.5
For sensor part P(0,0): 50*0.25

The factors 1.0, 0.5, 0.5 and 0.25 correspond to the hardware-weighting factors for the different regions as shown in FIG. 3C. Thus, the hardware-weighted captured activity level of sensor X1 is:

$$(50*0.5+50*0.25)/(1+0.5+0.5+0.25)=17$$

Furthermore, sensors X2 and X3, which are the sensor elements in upper-right and lower-right corners, capture a hardware-weighted activity level of 6, and sensor X4, Which is the sensor element in the lower-left corner, captures a hardware-weighted activity level of 17. The position calculation may involve a software weighting function which may be applied to the hardware-weighted activity levels of the respective sensor elements. For example, the position may now be calculated as follows:

$$X=(-17+6+6-17)/(17+6+6+17)=-0.5$$

$$Y=(17+6-6-17)/(17+6+6+17)=0$$

Figure 10:
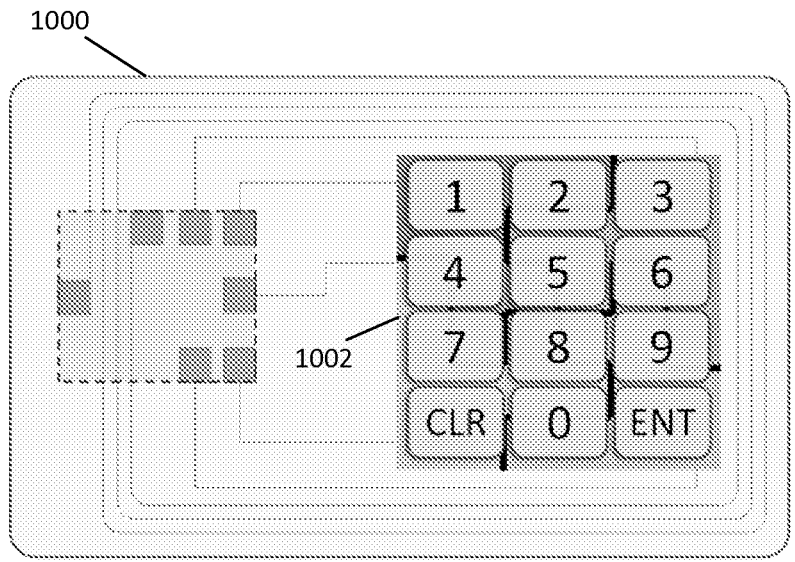
FIG. 10 shows a further illustrative embodiment of a smart card.

As mentioned, in the examples described with reference to FIGS. 9B to 9E, a relatively simple software weighting is applied in the position calculation. The position calculation has been shown with simplified, rounded numbers. In particular, the position calculation is performed as follows:

$$X(@point)=\text{Sum}(Wx_i*CL_i)_{i=1 \text{ to } 4}/\text{Sum}(CL_i)_{i=1 \text{ to } 4}$$

$$Y(@point)=\text{Sum}(Wy_i*CL_i)_{i=1 \text{ to } 4}/\text{Sum}(CL_i)_{i=1 \text{ to } 4}$$

wherein:
Wxi=x-position weight factor for sensor i
Wyi=y-position weight factor for sensor i
Cli=Capture level of sensor i FIG. 10 shows a further illustrative embodiment of a smart card 1000. The smart card 1000 comprises a user interface unit 1002 having a four-sensor structure as shown, for example, in FIG. 2 and FIG. 5. A typical application of a user interface unit 1002 having a four-sensor structure may be a keypad or PIN-pad for smart cards, for instance for user authentication purposes in governmental, banking or payment use cases. The user may touch subsequent positions on the user interface unit 1002 in order to enter a PIN code, for example. In case of a touch by a human finger the identified touch position may be communicated to the secure element of a smart card for PIN-code decoding and PIN-code verification.

Figure 11:
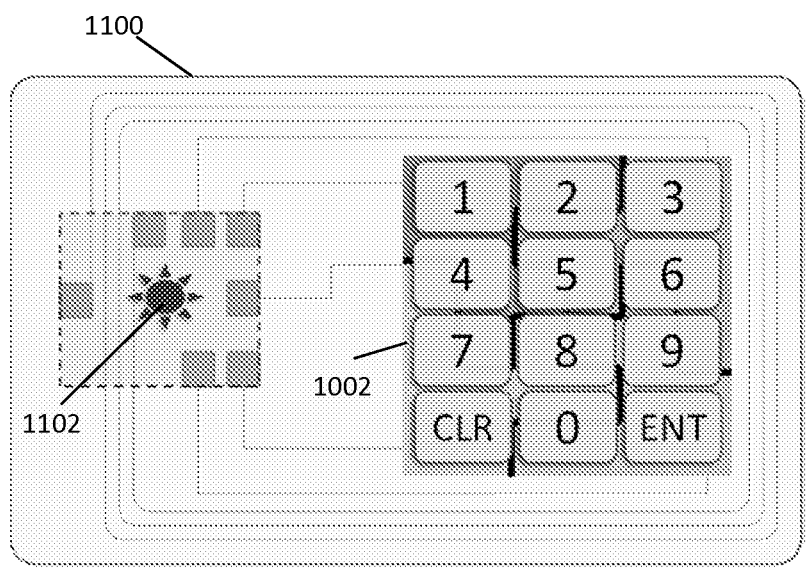
FIG. 11 shows a further illustrative embodiment of a smart card.

FIG. 11 shows a further illustrative embodiment of a smart card 1100. In this embodiment, a processing module comprising an RFID module and processing unit may additionally be equipped with an optical or acoustic feedback indicator 1102, by means of which it may provide user guidance and user feedback during data entry. A use case for this embodiment may for example be an eID card or a physical access card for high security environments.

Figure 12:
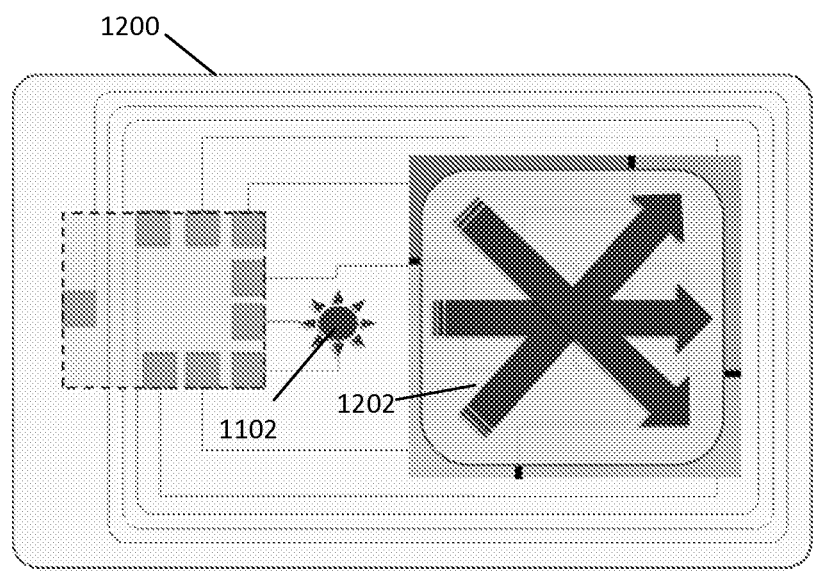
FIG. 12 shows a further illustrative embodiment of a smart card.

FIG. 12 shows a further illustrative embodiment of a smart card 1200. In this embodiment, the user interface unit may further be arranged to receive confirmation or activation gestures 1202, for example horizontal and/or diagonal swipes, which may activate the smart card's communication interface. This mechanism may be used to secure contactless banking cards against unwanted access, for example. The smart card 1200 may additionally be equipped with an optical or acoustic feedback indicator 1102 placed on the inlay, by means of which it may provide user guidance and user feedback during data entry. Placing the feedback indicator 1102 on the inlay provides more flexibility to the smart card manufacturer, in the sense that the manufacturer may decide whether the smart card should include a feedback indicator or not.

It is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

LIST OF REFERENCE SIGNS 100 user interface unit
102a, 102b, 102c, 102d capacitive sensors
104 usable area
200 user interface unit
202a, 202b, 202c, 202d capacitive sensors
204a, 204b, 204c, 204d intermediate regions
300 user interface unit
302a, 302b, 302c, 302d sensor-specific electrodes
304 common electrode
306 user interface unit
308 user interface unit
400 usable area
500 user interface unit
502a, 502b, 502c, 502d capacitive sensors
600 smart card
602 processing module
604 antenna
606a, 606b, 606c, 606d sensor-specific signal lines
606e common signal line
700 processing module
702 sub-module
704 sub-module
706a, 706b, 706c, 706d sensor-specific signal lines
706e common signal line
708 optical feedback indicator
710a, 710b antenna terminals
800 processing module
802 monolithically integrated circuit
902, 904, 906, 908 scanning steps
910 filter and weighted averaging step
912 position determination
914 summing sampler
916 sample register
1000 smart card
1002 user interface unit
1100 smart card
1102 feedback indicator
1200 smart card
1202 confirmation or activation gestures

The invention claimed is:

1. A user interface unit for a smart card, said user interface unit comprising a two-dimensional capacitive sensor array, wherein the capacitive sensor array comprises an array of corner sensor elements each comprising a capacitor over an area associated with each corner sensor element, wherein the respective capacitors of neighbouring corner sensor elements in each dimension extend towards each other thereby defining at least one intermediate region therebetween, the area of the or each intermediate region covered by the respective capacitors being in a respective fixed ratio.

2. A user interface unit as claimed in claim 1, wherein the intermediate regions in both dimensions define at least one central region therebetween, and the capacitor from each corner sensor element extends over the or each respective central region in a respective fixed ratio.

3. A user interface unit as claimed in claim 1, wherein each capacitor has a first electrode and a second electrode, wherein the first electrode is specific to the sensor element comprising the respective capacitor, and wherein the second electrode is a common signal electrode.

4. A user interface unit as claimed in claim 1, wherein the at least one intermediate region is defined by interdigitated first electrodes of the capacitors extending from the neighbouring corner sensor units.

5. A user interface unit as claimed in claim 1, wherein the at least one intermediate region is defined by first electrodes of the capacitors extending from the neighbouring corner sensor units in a mutual spiral arrangement.

6. A smart card comprising a user interface unit as claimed in claim 1, said smart card further comprising a processing unit for processing sensor signals generated by the user interface unit and a plurality of signal lines for transmitting said sensor signals from the user interface unit to the processing unit, wherein each one of the capacitors is connected to one of the signal lines, wherein each one of the capacitors is arranged to generate one of the sensor signals and to transmit said one of the sensor signals to the processing unit through said one of the signal lines.

7. A smart card as claimed in claim 6, wherein the processing unit is arranged to execute a computer program which applies a weighting function to the sensor signals generated by the user interface unit.

8. A smart card as claimed in claim 6, said smart card further comprising a wireless communication module and a loop antenna for wireless communication, wherein the wireless communication module comprises an integrated antenna cross-over, said integrated antenna cross-over comprising a first antenna terminal of the wireless communication module being located outside the loop of the antenna and a second antenna terminal of the wireless communication module being located inside the loop of the antenna.

9. A smart card as claimed in claim 8, wherein the processing unit and the wireless communication module are comprised in a monolithically integrated circuit.

10. A smart card as claimed in claim 8, wherein the user interface unit and the loop antenna are integrated in a single-layer printed circuit-board.

11. A smart card as claimed in claim 6, said smart card further comprising a keypad which overlays the user interface unit and/or which is integrated with the user interface unit.

12. A smart card as claimed in claim 6, said smart card further comprising a user feedback indicator for guiding a user through a touch-based user input process.

13. A smart card as claimed in claim 6, wherein the user interface element is arranged to receive a touch-based user input which represents a gesture for activating a function of the smart card.

14. A smart card as claimed in claim 6, wherein the processing unit is further arranged to perform up-sampling by means of pipeline processing of sampled sensor signals.

15. A method of manufacturing a user interface unit for a smart card, the method comprising providing the user interface unit with a two-dimensional capacitive sensor array and providing the capacitive sensor array with an array of corner sensor elements each comprising a capacitor over an area associated with each corner sensor element, wherein the respective capacitors of neighbouring corner sensor elements in each dimension extend towards each other thereby defining at least one intermediate region therebetween, the area of the or each intermediate region covered by the respective capacitors being in a respective fixed ratio.

* * * * *